(12) United States Patent
Lee

(10) Patent No.: US 10,672,849 B2
(45) Date of Patent: Jun. 2, 2020

(54) ORGANIC LIGHT EMITTING DISPLAY DEVICE COMPRISING MULTI-TYPE THIN FILM TRANSISTOR

(71) Applicant: LG Display Co., Ltd., Seoul (KR)

(72) Inventor: YoungJang Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/624,565

(22) Filed: Jun. 15, 2017

(65) Prior Publication Data

US 2018/0151654 A1 May 31, 2018

(30) Foreign Application Priority Data

Nov. 30, 2016 (KR) .......................... 10-2016-0161216

(51) Int. Cl.
*H01L 27/32* (2006.01)
*H01L 29/417* (2006.01)
(Continued)

(52) U.S. Cl.
CPC ...... *H01L 27/3262* (2013.01); *H01L 27/3258* (2013.01); *H01L 27/3265* (2013.01);
(Continued)

(58) Field of Classification Search
CPC ........... H01L 27/3262; H01L 29/41733; H01L 27/3258; H01L 27/3265; H01L 27/3272; H01L 27/3276; H01L 27/1225; H01L 27/124; H01L 27/1248; H01L 27/1251; H01L 27/1255; H01L 29/4908; H01L 29/78618; H01L 29/78633;
(Continued)

(56) References Cited

U.S. PATENT DOCUMENTS

2004/0129936 A1* 7/2004 Park .................... H01L 27/3253
257/40
2015/0214256 A1 7/2015 Miyairi
(Continued)

FOREIGN PATENT DOCUMENTS

EP 3270417 A1 1/2018
KR 2015101414 * 9/2015
(Continued)

OTHER PUBLICATIONS

Extended European Search Report for European Patent Application No. EP 17192289.1, dated Mar. 21, 2018, 8 Pages.

*Primary Examiner* — Benjamin T Liu
(74) *Attorney, Agent, or Firm* — Fenwick & West LLP

(57) ABSTRACT

A pixel of an organic light emitting display device includes a driving thin film transistor (TFT) on a substrate, a switching TFT on the substrate, and an organic light emitting diode (OLED) on the substrate. The driving TFT includes a first active layer including poly-Si, a first insulation layer on the first active layer, and a first source electrode and a first drain electrode contacting the first active layer. At least a portion of the first source electrode and at least a portion of the first drain electrode are disposed on different layers. The switching TFT is electrically connected to the driving TFT, and the switching TFT includes a second active layer including oxide semiconductor material. The OLED is electrically connected to the driving TFT.

23 Claims, 11 Drawing Sheets

(51) Int. Cl.
  *H01L 27/12*    (2006.01)
  *H01L 29/49*    (2006.01)
  *H01L 29/786*   (2006.01)

(52) U.S. Cl.
  CPC ...... *H01L 27/3272* (2013.01); *H01L 27/3276* (2013.01); *H01L 29/41733* (2013.01); *H01L 27/124* (2013.01); *H01L 27/1225* (2013.01); *H01L 27/1248* (2013.01); *H01L 27/1251* (2013.01); *H01L 27/1255* (2013.01); *H01L 29/4908* (2013.01); *H01L 29/7869* (2013.01); *H01L 29/78618* (2013.01); *H01L 29/78633* (2013.01); *H01L 29/78675* (2013.01); *H01L 2227/323* (2013.01); *H01L 2251/5315* (2013.01)

(58) Field of Classification Search
  CPC ........... H01L 29/78675; H01L 29/7869; H01L 2227/323; H01L 2251/5315; H01L 27/1229
  See application file for complete search history.

(56) References Cited

U.S. PATENT DOCUMENTS

| | | | |
|---|---|---|---|
| 2015/0243722 A1* | 8/2015 | Kwon ................. | H01L 27/3262 257/40 |
| 2016/0329390 A1* | 11/2016 | Ono .................... | H01L 27/3262 |
| 2017/0315392 A1* | 11/2017 | Noh ..................... | G02F 1/1368 |

FOREIGN PATENT DOCUMENTS

| KR | 20150101414 A | 9/2015 |
|---|---|---|
| KR | 2015101414 | * 12/2015 |

* cited by examiner

ORGANIC LIGHT EMITTING DISPLAY DEVICE COMPRISING MULTI-TYPE THIN FILM TRANSISTOR

CROSS-REFERENCE TO RELATED APPLICATIONS

This application claims the priority of Republic of Korea Patent Application No. 10-2016-0161216 filed on Nov. 30, 2016, in the Korean Intellectual Property Office, the disclosure of which is incorporated herein by reference.

BACKGROUND

Field

The present disclosure relates to an organic light emitting display device including different types of thin film transistors disposed on a single substrate.

Description of the Related Art

Recently, with advances in display technology, various display devices with excellent performance, thinner characteristics, more lightweight, and lower power consumption have been developed.

Specific examples of display devices include a liquid crystal display (LCD) device, an organic light emitting display (OLED) device, an electro phoretic display (EPD) device, and an electro-wetting display (EWD) device, and the like. Particularly, the OLED device, which is a display device with self-emitting characteristics, has excellent characteristics in terms of viewing angle, contrast ratio, response speed, power consumption, etc., as compared with the LCD device.

The OLED device includes a display area where an organic light emitting diode used for displaying an image and a pixel circuit for driving the organic light emitting diode are disposed. Also, the OLED device includes a non-display area which is adjacent to the display area and in which a driving circuit is disposed. Particularly, a plurality of thin film transistors exist in the pixel circuit and in the driving circuit so as to drive the organic light emitting diodes in a plurality of pixels.

The thin film transistors (TFTs) can be classified by the material of its active layer. Particularly, low temperature poly-silicon (LTPS) TFTs and oxide semiconductor TFTs are commonly used. However, in related art OLED devices, only LTPS TFTs or only oxide semiconductor TFTs are used on a single substrate in pixel circuits and driving circuits. However, having only LTPS TFTs or only oxide semiconductor TFTs in the pixel circuit and the driving circuit result in certain limitations in performance of the OLED device. Accordingly, there has been a need to employ different types of thin film transistors in a single OLED device.

SUMMARY

The inventors of the present disclosure recognized the above-described need and conducted research with respect to employing different types of thin film transistors on a single substrate for an OLED display. As a result, the inventors have conceived an organic light emitting display device in which one or more polycrystalline silicon thin film transistors and one or more oxide semiconductor thin film transistor are formed together on a single substrate.

Accordingly, an object to be achieved by the present disclosure is to minimize damage to an oxide semiconductor layer which may occur by etching during a process of forming a source electrode and a drain electrode of a polycrystalline silicon thin film transistor.

The objects of the present disclosure are not limited to the aforementioned object, and other objects, which are not mentioned above, will be understood by a person having ordinary skill in the art from the following description.

According to an aspect of the present disclosure, there is provided an organic light emitting display device including a multi-type thin film transistor. The organic light emitting display device includes a substrate, an LTPS thin film transistor disposed on the substrate, and an oxide semiconductor thin film transistor disposed on the substrate. A source electrode and a drain electrode of the oxide semiconductor thin film transistor are formed of a material capable of being wet-etched. The source electrode and the drain electrode of the oxide semiconductor thin film transistor are disposed on different layers from one of a source electrode or a drain electrode of the LTPS thin film transistor. An active layer of the oxide semiconductor thin film transistor has a larger width than that of a structure in which the source electrode and the drain electrode of the oxide semiconductor thin film transistor are on the same layer as the source electrode and the drain electrode of the LTPS thin film transistor.

According to another aspect of the present disclosure, there is provided an organic light emitting display device including a multi-type thin film transistor. The organic light emitting display device includes a substrate defined into a display area and a non-display area on one side of the display area, an LTPS thin film transistor and an oxide semiconductor thin film transistor on the display area, a first electrode and a second electrode connected to an active layer of the LTPS thin film transistor, and a third electrode and a fourth electrode connected to an active layer of the oxide semiconductor thin film transistor. The first electrode and the second electrode consist of different materials from each other. The second electrode, the third electrode, and the fourth electrode consist of the same material.

Details of other exemplary embodiments will be included in the detailed description of the invention and the accompanying drawings.

According to the present disclosure, it is possible to provide an organic light emitting display device having a new structure that resolves certain problems when a multi-type thin film transistors are provided on a single substrate. A method of manufacturing such new organic light emitting display device is also provided herein.

Specifically, according to the present disclosure, a source electrode and a drain electrode of an oxide semiconductor thin film transistor are formed of a material that is capable of being wet-etched. Thus, it is possible to minimize damage to an oxide semiconductor layer.

Further, according to the present disclosure, the source electrode and the drain electrode of the LTPS semiconductor thin film transistor are disposed on different layers from each other. Thus, it is possible to maximize the width of the oxide semiconductor layer, which results in maximized performance thereof.

Embodiments also relate to an organic light emitting display device including a substrate and a pixel on the substrate. The pixel includes a driving thin film transistor (TFT) on the substrate, a switching TFT on the substrate, and an organic light emitting diode (OLED) on the substrate. The driving TFT includes a first active layer including poly-Si, a first insulation layer on the first active layer, and a first source electrode and a first drain electrode contacting the first active layer. At least a portion of the first source electrode and at least a portion of the first drain electrode are disposed on different layers. The switching TFT is electrically connected to the driving TFT, and the switching TFT includes a second active layer including oxide semiconductor material. The OLED is electrically connected to the driving TFT.

Embodiments also relate to an organic light emitting display device including a substrate, and a pixel on the substrate. The pixel includes a first thin film transistor (TFT) on the substrate, a second TFT on the substrate, and an organic light emitting diode (OLED) on the substrate. The first TFT includes a first active layer including a first material, and a first source electrode and a first drain electrode contacting the first active layer. At least a portion of the first source electrode and at least a portion of the first drain electrode are disposed on different layers. The second TFT includes a second active layer including a second material different from the first material. The second active layer is disposed on a different layer than the first active layer is disposed on. The second TFT also includes a second source electrode and a second drain electrode contacting the second active layer. The OLED is electrically connected to the first TFT or the second TFT.

Embodiments also relate to an organic light emitting display device including a substrate and a pixel on the substrate. The pixel includes a driving thin film transistor (TFT) on the substrate, a switching TFT on the substrate, and an organic light emitting diode (OLED) on the substrate. The driving TFT includes a first active layer including poly-Si, a first insulation layer on the first active layer, and a first source electrode and a first drain electrode contacting the first active layer. The switching TFT is electrically connected to the driving TFT, and the switching TFT includes a second active layer including oxide semiconductor material. The OLED is electrically connected to the driving TFT. The pixel also includes a second insulation layer on the first active layer, and a passivation layer on the second insulation layer and on the second active layer. At least a portion of the first drain electrode is disposed on the second insulation layer, and at least a portion of the first source electrode is disposed on the passivation layer.

The effects of the present disclosure are not limited to the aforementioned effects, and various other effects can be deduced or achieved.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
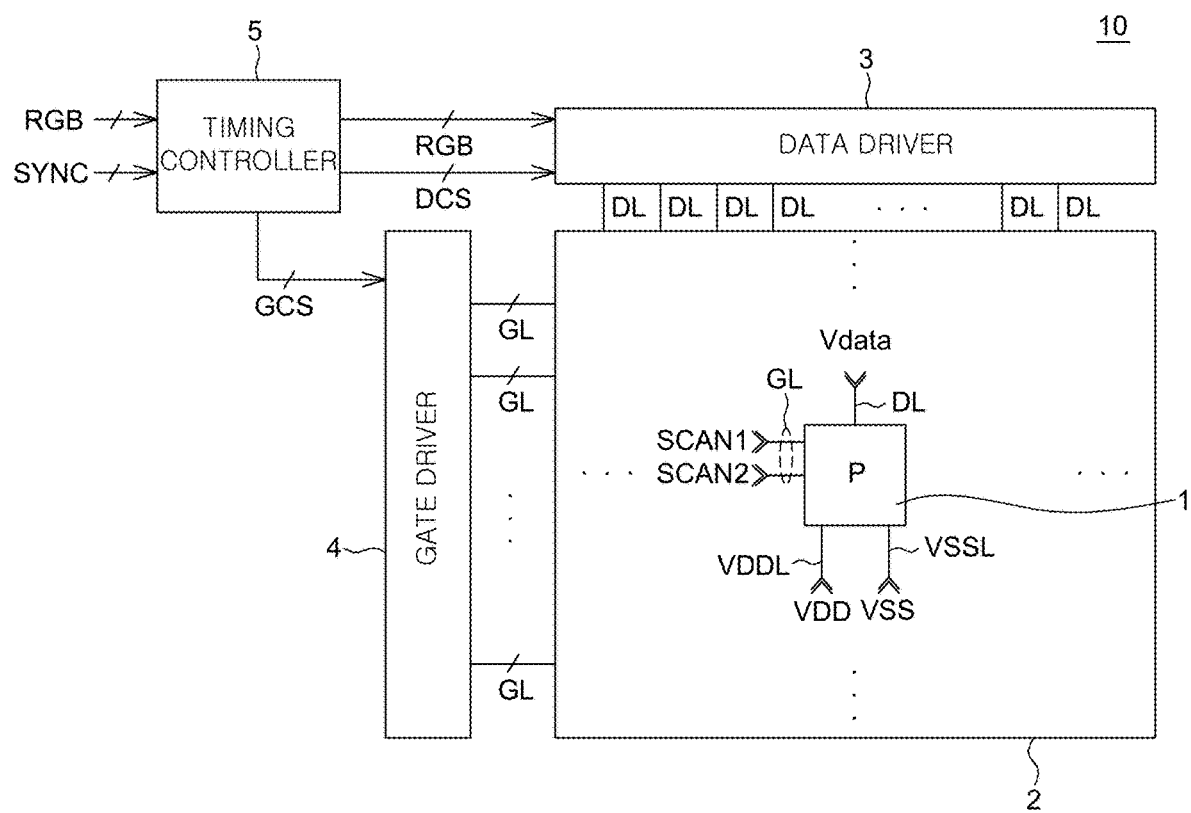
FIG. 1 is a configuration of an organic light emitting display device according to an embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of certain related technologies may have been omitted to avoid unnecessary obscuring of the subject matter of the present disclosure. The terms such as "including," "having," and "consist of" used herein are generally intended to allow other components to be added unless the terms are used with the term "only". Any references to singular elements may include a plurality of elements unless expressly stated otherwise.

Components are interpreted to include an ordinary margin of error or error range even if not expressly stated.

When a positional relationship between two parts is described using the terms such as "on", "above", "below", and "next", one or more parts may be positioned between the two parts unless the terms are used with the term "immediately" or "directly".

When an element or layer is referred to as being "on" or "above" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals typically denote the same elements.

Since the size and thickness of each component illustrated in the drawings may not be to scale, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

In organic light emitting display devices each including a multi-type thin film transistor according to various embodiments of the present disclosure, at least two types of thin film transistors (with each TFT type having an active layer material different from that of another TFT type) are formed on the same substrate. A multi-type thin film transistor refers to different types of thin film transistors formed on a single substrate. Herein, a thin film transistor including an active layer formed of a poly-silicon material and a thin film transistor including an active layer formed of a metal oxide are used as the at least two types of thin film transistors.

In the organic light emitting display devices having multi-type thin film transistors according to various embodiments of the present disclosure, an LTPS thin film transistor employs low temperature poly-silicon as its active layer. Poly-silicon material has high mobility, low energy power consumption, and excellent reliability. Thus, the LTPS thin film transistor can be used in a gate driver and/or a multiplexer (MUX) that are used in operating the diodes in an OLED display. Thus, for example, LTPS thin film transistors may be used as the driving thin film transistors within each of the pixels of an organic light emitting display device.

Also, in the organic light emitting display devices having multi-type thin film transistors according to various embodiments of the present disclosure, an oxide semiconductor thin film transistor has an active layer formed of an oxide semiconductor material. The oxide semiconductor material has a greater band gap than a silicon material and thus, electrons cannot easily cross the band gap in an off state, which results in a low off-current. Therefore, the oxide semiconductor thin film transistor is suitable for switching thin film transistors which remain on for a short time and off for a long time during operation of a display device. Also, since the off-current is low, the size of a secondary capacitance can be reduced. Therefore, the oxide semiconductor thin film transistor is suitable for high-resolution display devices.

In the organic light emitting display devices having multi-type thin film transistors according to various embodiments of the present disclosure, the LTPS thin film transistor and the oxide semiconductor thin film transistor having different properties are disposed on the same substrate. Thus, it is possible to provide optimum functionality for the overall display device.

FIG. 1 is a configuration view of an organic light emitting display device according to an embodiment of the present disclosure.

An organic light emitting display device illustrated in FIG. 1 includes a display panel 2 on which a plurality of gate lines GL, a plurality of data lines DL, a pixel 1, a gate driver 4, a data driver 3, and a timing controller 5 are provided. The gate driver 4 transmits a driving signal for the pixel 1 via the plurality of gate lines GL. The data driver 3 transmits a data voltage for the pixel 1 via the plurality of data lines DL. The timing controller 5 provides timing control to image data RGB and supplies the image data RGB to the data driver 3. Further, the timing controller 5 outputs a gate control signal GCS and a data control signal DCS to control the gate driver 4 and the data driver 3.

In the embodiments of the present disclosure, each pixel 1 includes an organic light emitting diode (OLED) and a pixel driving circuit that includes a driving transistor for supplying a driving current to the OLED and thus independently drives the OLED. Further, the pixel driving circuit can compensate for differences in electrical characteristics, such as threshold voltage (Vth) and mobility, of the driving transistor. Also, the pixel driving circuit can reduce a luminance difference between the pixels 1 caused by differences in the respective currents supplied to the OLEDs.

The display panel 2 includes a plurality of gate lines GL and a plurality of data lines DL. The plurality of gate lines GL may extend in a first direction, and the plurality of data lines DL may extend in a second direction intersecting the first direction. A plurality of pixels 1 may be disposed at or near the intersections of the lines GL and DL. Each pixel 1 includes an OLED and a pixel driving circuit. Also, each pixel 1 is connected to a gate line GL, a data line DL, a high-potential voltage supply line VDDL, and a low-potential voltage (VSS) supply line VSSL. The voltage supply lines VDDL and VSSL may also extend in a first or second direction on the substrate. Particularly, the high-potential voltage supply line VDDL may be formed of a material having low resistivity.

The gate driver 4 supplies a plurality of gate electrode signals to the plurality of gate lines GL in response to a plurality of gate control signals GCS supplied from the timing controller 5. The plurality of gate electrode signals includes first and second scan signals SCAN1 and SCAN2. These signals are supplied to each pixel 1 through the plurality of gate lines GL. A high-potential voltage (VDD) has a higher voltage than a low-potential voltage (VSS). The low-potential voltage (VSS) may be a ground voltage.

The data driver 3 converts digital image data RGB input from the timing controller 5 into a data voltage Vdata using reference gamma voltages in response to a plurality of data control signals DCS supplied from the timing controller 5. Then, the data driver 3 supplies the converted data voltage Vdata to the plurality of data lines DL. Meanwhile, the data driver 3 outputs the data voltage Vdata during a programming (time) period of each pixel 1.

The timing controller 5 processes the image data RGB so as to be matched to the size and resolution of the display panel 2, and then supplies the image data RGB to the data driver 3. The timing controller 5 generates a plurality of gate control signals and data control signals GCS and DCS by using synchronization signals SYNC, e.g., a dot clock DCLK, a data enable signal DE, a horizontal synchronization signal Hsync, and a vertical synchronization signal Vsync. Further, the timing controller 5 supplies the generated gate and data control signals GCS and DCS to the gate driver 4 and the data driver 3, respectively, and thus controls the gate driver 4 and the data driver 3.

Hereinafter, a pixel according to the embodiments of the present disclosure will be described in more detail.

Figure 2:
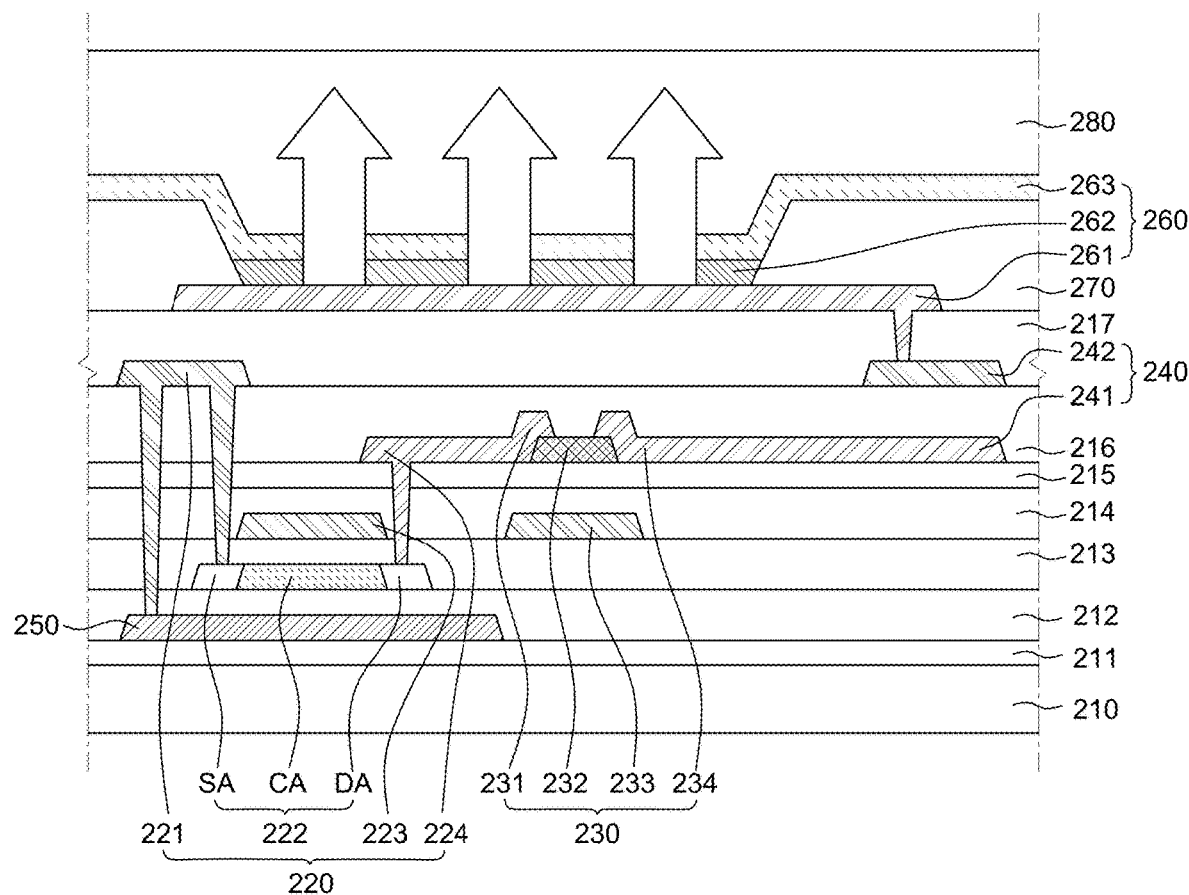
FIG. 2 is a cross-sectional view schematically illustrating a pixel structure illustrated in FIG. 1 according to an embodiment of the present disclosure.

FIG. 2 is a cross-sectional view schematically illustrating a pixel structure illustrated in FIG. 1.

Referring to FIG. 2, a structure of the pixel 1 in the organic light emitting display device will be described. As illustrated in FIG. 2, the pixel 1 according to the exemplary embodiments of the present disclosure includes a substrate 210, a buffer layer 211, an LTPS thin film transistor 220, an oxide semiconductor thin film transistor 230, a storage capacitor 240, and an OLED 260.

Also, the pixel 1 according to the embodiments of the present disclosure includes an active buffer layer 212, an LTPS gate insulation layer 213, an interlayer insulation layer 214, an oxide semiconductor gate insulation layer 215, a passivation layer 216, an overcoating layer 217, a bank 270, and an encapsulation unit 280.

Hereinafter, each of the components of an organic light emitting display device 200 will be described in detail.

The substrate 210 (i.e. array substrate) supports various components of the organic light emitting display device 200. The substrate 210 may be formed of glass or a plastic material having flexibility. For example, if the substrate 210 is formed of polyimide (PI), a manufacturing process of an organic light emitting display device may be performed in a state where a temporary supporting substrate formed of solid glass is disposed under the substrate 210. In this case, the supporting substrate is later removed during the manufacturing process. Further, after the supporting substrate is removed, a back plate for supporting the substrate 210 may be disposed under the substrate 210.

A display area and a non-display area may be defined on the substrate 210. The display area is an area where the pixels 1 are disposed to display an image via the organic light emitting display device 200. The non-display area is an area other than the display area, and may be located adjacent to or on at least one side of the display area. In the non-display area, various circuits, lines, etc. for driving the pixel 1 are disposed.

Then, the buffer layer 211 may be formed on the entire surface of the substrate 210. That is, the buffer layer 211 can be formed on the entirety of the display area and the non-display area of the substrate 210. The buffer layer 211 may have a structure in which a plurality of thin films is deposited. Herein, the buffer layer 211 will be described as a single layer for convenience. For example, the buffer layer 211 may be formed of silicon oxide (SiOx) that does not noticeably affect the OLED. Further, a part of the buffer layer 211 positioned in the non-display area may have a specific pattern in the shape of grooves, walls, etc. in order to prevent or minimize cracks or other damage which may occur during bending.

Then, a bottom shield metal (hereinafter, referred to as "BSM") 250 may be formed on the buffer layer 211. The BSM 250 may be positioned to overlap with the LTPS thin film transistor 220 which acts as a driving thin film transistor of the pixel 1. The BSM 250 may be made of a molybdenum (Mo) material.

The BSM 250 can basically prevent the generation of electrical charges on a surface of the substrate 210 and can block undesirable light from external sources.

Specifically, in the pixel 1 according to the embodiments of the present disclosure, active layers of various thin film transistors including a driving transistor DT may be damaged by a laser release process that is used for removing the temporary supporting substrate (glass) from the array substrate (plastic). Further, a negative charge trap may occur in a sacrificial layer due to such laser energy and/or undesirable light from external sources. Thus, positive (+) charges may move or transfer from the polyimide (PI) substrate 210 towards the sacrificial layer. Therefore, an undesirable potential at the surface of the substrate 210 may increase, which leads to an undesirable decrease in the current flowing in the transistors.

Also, a source electrode 221 of the LTPS thin film transistor 220 connected to the OLED is maintained in a floating state while the LTPS thin film transistor 220 is turned off. In this case, as a potential at the surface of the substrate 210 increases, a parasitic capacitance can be generated between the substrate 210 and the source electrode 221 of the LTPS thin film transistor 220. Thus, the source electrode 221 may be continuously affected by such parasitic capacitance. Therefore, a current flowing in the source electrode 221 of the LTPS thin film transistor 220 can be undesirably shifted by the parasitic capacitance. Accordingly, so-called image sticking effects may occur.

After the laser release process, if the pixel 1 of the organic light emitting display device 100 including the substrate 210 is driven, heat may be generated from the substrate 210 formed of a plastic-based polymer material such as polyimide (PI). Therefore, electric charges generated from the substrate 210 may move or travel. Such electric charges affect the active layers of the thin film transistors and thus reduces the reliability of the organic light emitting display device 200.

As illustrated in FIG. 2, the BSM 250 may be connected to the source electrode 221 of the LTPS thin film transistor 220 and may be applied with the same voltage as the source electrode 221. Therefore, it is possible to solve the above-mentioned image sticking effects or current drop problems which reduce the driving current of a thin film transistor. However, the present disclosure is not limited thereto. The BSM 250 may be connected to a drain electrode 224 or a gate electrode 223 of the LTPS thin film transistor 220, or may be electrically floated.

Then, the active buffer layer 212 configured to protect an active layer 222 of the LTPS thin film transistor 220 is disposed on the buffer layer 211 and covering the BSM 250. The active buffer layer 212 may be formed only in the display area of the substrate 210. The active buffer layer 212 may be formed of the same material as the buffer layer 211.

Then, the LTPS thin film transistor 220 is disposed on the active buffer layer 212. The LTPS thin film transistor 220 may include the active layer 222, the gate electrode 223, the source electrode 221, and the drain electrode 224. The active layer 222 of the LTPS thin film transistor 220 is formed of poly-silicon. And the gate electrode 223, the source electrode 221, and the drain electrode 224 are formed of a conductive metal material.

The active layer 222 of the LTPS thin film transistor 220 is disposed on the active buffer layer 212. The active layer 222 of the LTPS thin film transistor 220 includes a channel area CA where a channel is formed when the LTPS thin film transistor 220 is driven and a source area SA and a drain area DA on both distal ends of the channel area CA. The channel area CA, the source area SA, and the drain area DA are defined by ion doping (impurity doping).

Meanwhile, in the organic light emitting display device 200 illustrated in FIG. 2, the BSM 250 and the active buffer layer 212 may be omitted. In this case, the active layer 222 of the LTPS thin film transistor 220 may be disposed on the buffer layer 211.

The active layer 222 of the LTPS thin film transistor 220 contains poly-silicon. An amorphous-silicon (a-Si) material is deposited on the buffer layer 211 and a dehydrogenation process and a crystallization process are performed thereto, so that poly-silicon is formed. The active layer 222 is formed by patterning the poly-silicon. Further, after the interlayer insulation layer 214 is formed, an activation process and a hydrogenation process are further performed, so that the active layer 222 is completed.

Then, the gate insulation layer 213 of the LTPS thin film transistor 220 is disposed on the active layer 222 of the LTPS thin film transistor 220 and the buffer layer 211. The gate insulation layer 213 of the LTPS thin film transistor 220 may be formed as a single layer of silicon nitride (SiNx) or silicon oxide (SiOx) or a multi-layer of silicon nitride (SiNx) and silicon oxide (SiOx). In the gate insulation layer 213 of the LTPS thin film transistor 220, contact holes through which the source electrode 221 and the drain electrode 224 of the LTPS thin film transistor 220 are brought into contact with the source area SA and the drain area DA of the active layer 222 of the LTPS thin film transistor 220, respectively, are formed. At least a portion of the source electrode 221 and at least a portion of the drain electrode 224 are disposed in different layers. The source electrode 221 and the drain electrode 224 may be formed of different materials.

Then, the gate electrode 223 of the LTPS thin film transistor 220 is disposed on the gate insulation layer 213 of the LTPS thin film transistor 220. A metal layer such as molybdenum (Mo) is formed on the gate insulation layer 213 of the LTPS thin film transistor 220, and the gate electrode 223 of the LTPS thin film transistor 220 is formed by patterning the metal layer. The gate electrode 223 of the LTPS thin film transistor 220 is disposed on the gate insulation layer 213 of the LTPS thin film transistor 220. The gate electrode 223 may be overlapped with the channel area CA of the active layer 222 of the LTPS thin film transistor 220.

Referring to FIG. 2, the oxide semiconductor thin film transistor 230 includes an active layer 232, a gate electrode 233, a source electrode 231, and a drain electrode 234. The active layer 232 is formed of oxide semiconductor. In one embodiment, a wet etching process is used to form the active layer 232 of oxide semiconductor. And the gate electrode 233, the source electrode 231, and the drain electrode 234 are formed of a conductive metal. As described above, the oxide semiconductor thin film transistor 230 can be a switching thin film transistor in a pixel circuit.

Referring to FIG. 2, the gate electrode 233 of the oxide semiconductor thin film transistor 230 is formed on the gate insulation layer 213 of the LTPS thin film transistor 220. A conductive metal layer is formed on the gate insulation layer 213 of the LTPS thin film transistor 220, and the gate electrode 233 of the oxide semiconductor thin film transistor 230 is formed by patterning the metal layer.

The gate electrode 223 of the LTPS thin film transistor 220 and the gate electrode 233 of the oxide semiconductor thin film transistor 230 may be disposed on the same layer or formed at the same time through the same process. That is, the metal layer may be formed on the gate insulation layer 213 of the LTPS thin film transistor 220 and then patterned to form the gate electrode 223 of the LTPS thin film transistor 220 and the gate electrode 233 of the oxide semiconductor thin film transistor 230 at the same time. Thus, the gate electrode 223 of the LTPS thin film transistor 220 and the gate electrode 233 of the oxide semiconductor thin film transistor 230 may be formed of the same material to the same thickness on the same layer. Since the gate electrode 223 of the LTPS thin film transistor 220 and the gate electrode 233 of the oxide semiconductor thin film transistor 230 are formed at the same time through the same process, the processing time can be reduced and the number of masks can be reduced. Thus, the processing costs can also be reduced. However, the present disclosure is not limited thereto. For example, the gate electrode of the LTPS thin film transistor 220 may be disposed under the active layer 222, or the gate electrode of the oxide semiconductor thin film transistor 230 may be disposed on the active layer 232. Further, the gate electrode of the LTPS thin film transistor 220 and the gate electrode of the oxide semiconductor thin film transistor 230 may be disposed on different layers from each other between the active layer 222 of the LTPS thin film transistor 220 and the active layer 232 of the oxide semiconductor thin film transistor 230.

Then, the interlayer insulation layer 214 is disposed on the gate electrode 223 of the LTPS thin film transistor 220. The interlayer insulation layer 214 may be formed of silicon nitride (SiNx). Hydrogen contained in the interlayer insulation layer 214 can be diffused into the active layer 222 of the LTPS thin film transistor 220 during the hydrogenation process. To this end, the interlayer insulation layer 214 may be formed of silicon nitride (SiNx) having a high hydrogen content. The hydrogenation process is a process for filling vacancies in the active layer 222 of the LTPS thin film transistor 220 with hydrogen to stabilize the active layer 222.

In the interlayer insulation layer 214, one or more contact holes are formed. The contact holes of the interlayer insulation layer 214 can allow the source electrode 221 or the drain electrode 224 of the LTPS thin film transistor 220 to be connected to the source area SA or the drain area DA of the active layer 222 of the LTPS thin film transistor 220, respectively.

Then, the gate insulation layer 215 of the oxide semiconductor thin film transistor 230 is disposed on the interlayer insulation layer 214. The gate insulation layer 215 of the oxide semiconductor thin film transistor 230 may be formed of silicon oxide (SiOx), but is not limited thereto. The gate insulation layer 215 of the oxide semiconductor thin film transistor 230 may be formed of a material containing less hydrogen than the interlayer insulation layer 214. For example, the gate insulation layer 215 of the oxide semiconductor thin film transistor 230 may be formed of a material having a quality or a property capable of effectively blocking hydrogen diffusion. If the oxide semiconductor layer 232 is exposed to hydrogen, the active layer 232 of the oxide semiconductor thin film transistor 230 may be oxidized. Accordingly, a threshold voltage Vth of the oxide semiconductor thin film transistor 230 can be changed.

In the gate insulation layer 215 of the oxide semiconductor thin film transistor 230, one or more contact holes are formed. The contact holes of the gate insulation layer 215 can allow the source electrode 221 or the drain electrode 224 of the LTPS thin film transistor 220 to be connected to the source area SA or the drain area DA of the active layer 222 of the LTPS thin film transistor 220, respectively.

Then, the active layer 232 of the oxide semiconductor thin film transistor 230 is disposed on the gate insulation layer 215 of the oxide semiconductor thin film transistor 230. The active layer 232 of the oxide semiconductor thin film transistor 230 is formed of a metal oxide, and may be formed of various metal oxides such as IGZO. The active layer 232 of the oxide semiconductor thin film transistor 230 may be formed by depositing a metal oxide on the gate insulation layer 215 of the oxide semiconductor thin film transistor 230, performing a heat treatment thereto for stabilization, and patterning the metal oxide. Thus, the interlayer insulation layer 214 and the gate insulation layer 215 may be disposed over the gate electrode 223 of the LPTS TFT 220, and also disposed below the active layer 232 of the oxide semiconductor thin film transistor 230.

Then, the drain electrode 224 of the LTPS thin film transistor 220 and the source electrode 231 and the drain electrode 234 of the oxide semiconductor thin film transistor 230 are disposed on the gate insulation layer 215 of the oxide semiconductor thin film transistor 230. A metal layer such as molybdenum (Mo) is formed on the gate insulation layer 215 of the oxide semiconductor thin film transistor 230 and then patterned to form the drain electrode 224 of the LTPS thin film transistor 220 and the source electrode 231 and the drain electrode 234 of the oxide semiconductor thin film transistor 230. The drain electrode 224 of the LTPS thin film transistor 220 and the source electrode 231 and the drain electrode 234 of the oxide semiconductor thin film transistor 230 may be formed at the same time through the same process. Thus, the at least a portion of the drain electrode 224 of the LTPS thin film transistor 220, at least a portion of the source electrode 231 and the drain electrode 234 of the oxide semiconductor thin film transistor 230 may be formed directly on the gate insulation layer 215 due to the same patterning process. The patterning process for forming the drain electrode 224 of the LTPS thin film transistor 220 and the source electrode 231 and the drain electrode 234 of the oxide semiconductor thin film transistor 230 is performed through wet etching. The wet etchant for forming the drain electrode 224, the source electrode 231, and the drain electrode 234 reduces damage to the active layer 232 when the etching is performed, compared to a dry etch process. In one embodiment, the wet etchant for the drain electrode 224, the source electrode 231, and the drain electrode 234 is different from the wet etchant used to form the oxide semiconductor active layer 232. The drain electrode 224 of the LTPS thin film transistor 220, and the source electrode 231 and the drain electrode 234 of the oxide semiconductor thin film transistor 230 may contain molybdenum (Mo) and may be formed to a thickness of about 2000 Å.

The drain electrode 224 of the LTPS thin film transistor 220 is connected to the drain area DA of the active layer 222 of the LTPS thin film transistor 220 through the contact hole formed in the gate insulation layer 213 of the LTPS thin film transistor 220, the interlayer insulation layer 214 and the gate insulation layer 215 of the oxide semiconductor thin film transistor 230.

The active layer 232 may be electrically connected to the source electrode 231 and the drain electrode 234 of the oxide semiconductor thin film transistor 230 through ohmic contact.

The above-described source electrode 221 and drain electrode 224 of the LTPS thin film transistor 220 may be reversed with each other. For example, the source electrode 221 of the LTPS thin film transistor 220 illustrated in FIG. 2 may become a drain electrode or the drain electrode 224 of the LTPS thin film transistor 220 may become a source electrode depending on a direction of the current flow. Further, the same may apply to the source electrode 231 and the drain electrode 234 of the oxide semiconductor thin film transistor 230.

Then, the passivation layer 216 is disposed on the source electrode 231 and the drain electrode 234 of the oxide semiconductor thin film transistor 230. The passivation layer 216 is disposed to cover all of the source electrode 231, the drain electrode 234, the active layer 232, and the gate insulation layer 215 of the oxide semiconductor thin film transistor 230. Further, if the passivation layer 216 is disposed in direct contact with the active layer 232, the passivation layer 232 may be formed of a material having a low hydrogen content to minimize exposure of the active layer 232 to hydrogen. For example, the passivation layer 216 may be formed of a silicon oxide (SiOx) material, but is not limited thereto. Meanwhile, in the passivation layer 216, a contact hole through which the source electrode 221 of the LTPS thin film transistor 220 is connected to the active layer 222 is formed.

Then, the source electrode 221 of the LTPS thin film transistor 220 is disposed on the passivation layer 216. The source electrode 221 may be disposed on the same layer where the high-potential voltage supply line VDDL or the data line DL is disposed on. Therefore, the source electrode 221 of the LTPS thin film transistor 220 may be formed in the same layer and of the same material as the high-potential voltage supply line VDDL or the data line DL. The high-potential voltage supply line VDDL needs to transfer a high-potential voltage VDD throughout a large area without loss. Further, the data line DL needs to transfer a data signal to a faraway pixel without loss. Therefore, the high-potential voltage supply line VDDL or the data line DL may be formed of a material, such as aluminum (Al), having a low resistivity or a large thickness. The high-potential voltage supply line VDDL and the source electrode 221 of the LTPS thin film transistor 220 may be formed as a multi-layer structure including aluminum (Al). For example, the high-potential voltage supply line VDDL and the source electrode 221 of the LTPS thin film transistor 220 may be formed as a three-layer structure including titanium (Ti), aluminum (Al), and titanium (Ti) laminated in sequence. Aluminum (Al) is a metal vulnerable to corrosion. Thus, upper and lower parts of aluminum (Al) can be protected by titanium (Ti). The high-potential voltage supply line VDDL and the source electrode 221 of the LTPS thin film transistor 220 may be formed to a thickness of about 5000 Å.

The source electrode 221 of the LTPS thin film transistor 220 is connected to the source area SA of the active layer 222 of the LTPS thin film transistor 220 through the contact hole formed in the gate insulation layer 213 of the LTPS thin film transistor 220, the interlayer insulation layer 214, the gate insulation layer 215 of the oxide semiconductor thin film transistor 230, and the passivation layer 216. As illustrated in FIG. 2, if the BSM 250 is further provided under the LTPS thin film transistor 220, the source electrode 221 of the LTPS thin film transistor 220 may be connected to the BSM 250 through the contact hole formed in the gate insulation layer 213 of the LTPS thin film transistor 220, the interlayer insulation layer 214, the gate insulation layer 215 of the oxide semiconductor thin film transistor 230, the passivation layer 216, and the active buffer layer 212.

Thus, at least a portion of the drain electrode 224 may be formed directly on the gate insulation layer 215 of the oxide semiconductor TFT 230, and at least a portion of the source electrode 221 may be formed directly on the passivation layer 216 such that the drain electrode 224 and the source electrode 221 are formed in different layers. Moreover, the high-potential voltage supply line VDDL or the data line DL may be disposed directly on the passivation layer 216 as a result of forming the source electrode 221 of the LTPS TFT 220 in the same layer as the voltage supply line VDDL or the data line DL.

Then, the overcoating layer 217 is disposed on the passivation layer 216. The overcoating layer 217 may be an organic layer configured to flatten the upper parts of the LTPS thin film transistor 220 and the oxide semiconductor thin film transistor 230. FIG. 2 illustrates that surfaces of various insulation layers under the overcoating layer 217 are flattened, for convenience in explanation. However, actually, there may be surface level differences, irregularities or steps caused by the components of the LTPS thin film transistor 220 and the oxide semiconductor thin film transistor 230 or foreign materials. Thus, by flattening the upper parts of the LTPS thin film transistor 220 and the oxide semiconductor thin film transistor 230 or minimizing such irregularities and steps on the surface on which the organic light emitting diode 260 is disposed, the organic light emitting diode 260 can be formed with more reliability. Meanwhile, the overcoating layer 217 may also be omitted.

Referring to FIG. 2, the storage capacitor 240 is disposed on the substrate 210. The storage capacitor 240 includes a first electrode 241 disposed on the gate insulation layer 215 of the oxide semiconductor thin film transistor 230 and a second electrode 242 formed on the passivation layer 216. The first electrode 241 of the storage capacitor 240 may be formed of the same material at the same time as the source electrode 231 and the drain electrode 234 of the oxide semiconductor thin film transistor 230. Also, the second electrode 242 of the storage capacitor 240 may be formed of the same material at the same time as the source electrode 221 of the LTPS thin film transistor 220. Thus, the second electrode 242 may be disposed on the passivation layer 216.

In the organic light emitting display device 200 according to an embodiment illustrated in FIG. 2, the storage capacitor 240 is illustrated as including the first electrode 241 and the second electrode 242. However, the present disclosure is not limited thereto. The storage capacitor 240 may further include a plurality of auxiliary electrodes. For example, the storage capacitor 240 may include a third electrode formed on the same layer as the active layer 222 of the LTPS thin film transistor 220. Further, the storage capacitor 240 may further include a fourth electrode formed on the same layer as the gate electrode 233 of the semiconductor thin film transistor 230.

Meanwhile, in the overcoating layer 217, a contact hole through which the second electrode 242 of the storage capacitor 240 is connected to an anode electrode 261 is formed.

Then, the organic light emitting diode 260 is disposed on the overcoating layer 217. The organic light emitting diode 260 is formed on the overcoating layer 217 and includes the anode electrode 261, an organic layer 262 disposed on the anode electrode 261, and a cathode electrode 263 formed on the organic layer 262. The organic layer 262 is configured to emit a light of a specific color and may include one of a red organic emission layer, a green organic emission layer, a blue organic emission layer, and a white organic emission layer. If the organic layer 262 includes the white organic emission layer, a color filter configured to convert a white light from the white organic emission layer into a light of a different color may be disposed on the organic light emitting diode 260. Further, the organic layer 262 may further include various organic layers, such as a hole transport layer, a hole injection layer, an electron injection layer, an electron transport layer, etc., in addition to the organic emission layer. These layers may be independent, combined together, and/or some of their functionalities may be combined into a particular layer.

Referring to FIG. 2, the bank 270 is disposed on the overcoating layer 217 so as to cover both ends of the anode electrode 261. The bank 270 is formed of an insulating material and defines a pixel area by separating adjacent pixel areas in the display area. Then, the encapsulation unit 280 is disposed on the organic light emitting diode 260 and the bank 270. The encapsulation unit 280 protects the organic light emitting diode 260 from moisture. The encapsulation unit 280 may include an inorganic layer and an organic layer. Particularly, the encapsulation unit 280 may include a plurality of inorganic layers.

As described above, the drain electrode 224 of the LTPS thin film transistor 220 illustrated in FIG. 2 is formed of the same material as the source electrode 231 and the drain electrode 234 of the oxide semiconductor thin film transistor 230. For example, the drain electrode 224 of the LTPS thin film transistor 220 may be formed of molybdenum (Mo). Molybdenum can be etched through a process of wet etching. The process of wet etching can etch molybdenum without damage to the active layer 232 of the oxide semiconductor thin film transistor 230. The source electrode 231 and the drain electrode 234 of the oxide semiconductor thin film transistor 230 illustrated in FIG. 2 are formed in contact with the active layer 232. Therefore, if the active layer 232 of the oxide semiconductor thin film transistor 230 is damaged while the source electrode 231 and the drain electrode 234 of the oxide semiconductor thin film transistor 230 are formed, the reliability of the oxide semiconductor thin film transistor 230 may deteriorate.

Figure 3:
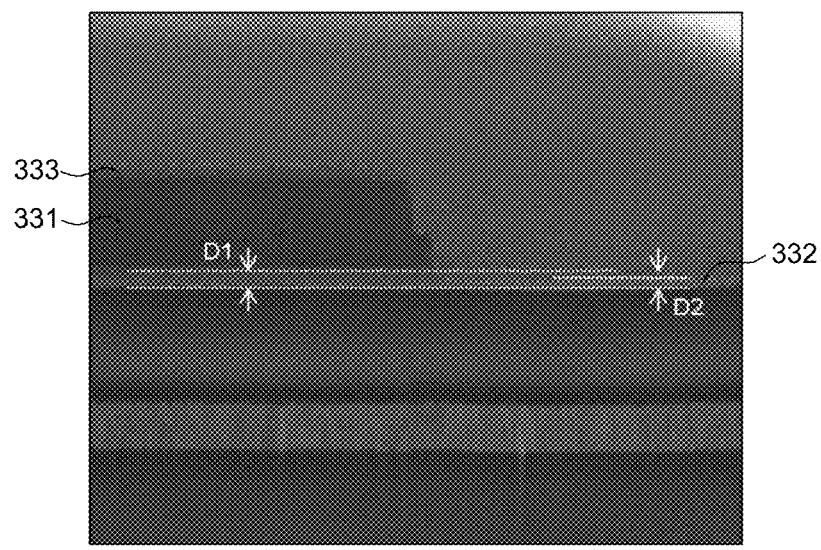
FIG. 3 is a cross-sectional view of an oxide semiconductor layer according to a Comparative Example.

FIG. 3 is a cross-sectional view of an oxide semiconductor layer according to a Comparative Example.

FIG. 3 is a cross-sectional view illustrating that a metal material layer capable of being dry-etched is formed on an oxide semiconductor layer 332 and then a metal pattern 331 is formed by a process of dry etching. In the Comparative Example illustrated in FIG. 3, a triple layer including titanium (Ti), aluminum (Al), and titanium (Ti) in sequence is used as a metal material layer. The metal pattern 331 illustrated in FIG. 3 corresponds to a source electrode or drain electrode of the oxide semiconductor thin film transistor. Referring to FIG. 3, it can be seen that a thickness D1 of the oxide semiconductor layer 332 in an area overlapped with the metal pattern 331 is different from a thickness D2 of the oxide semiconductor layer 332 in an area which is not overlapped with the metal pattern 331. That is, it can be seen that the oxide semiconductor layer 332 exposed to air during the process of dry etching becomes thinner than the oxide semiconductor layer 332 which is not exposed. This shows that a part of the oxide semiconductor layer 332 can be physically damaged during the process of dry etching. The physical damage of the oxide semiconductor layer 332 may depend on how long the oxide semiconductor layer 332 is exposed during the process of dry etching, or intensity of dry etching. FIG. 3 illustrates an example where the oxide semiconductor layer 332 is damaged by dry etching, resulting in a decrease in thickness of the oxide semiconductor layer 332. However, a surface of the oxide semiconductor layer 332 may be irregularly damaged and thus may be uneven. The oxide semiconductor layer 332 may be partially or entirely removed.

Referring to FIG. 3, an insulation layer 333 is formed on the metal pattern 331. In this case, the insulation layer 333 corresponds to the passivation layer 216 illustrated in FIG. 2. As a thickness of the metal pattern 331 is increased, it becomes difficult to form the insulation layer 333 to a uniform thickness on the entire surface of the metal pattern 331. Particularly, the insulation layer 333 formed on an inclined side surface of the metal pattern 331 may have a smaller thickness than the insulation layer 333 formed on an upper surface of the metal pattern 331. Also, the insulation layer 333 may not be formed on a section of the inclined side surface of the metal pattern 331. If the insulation layer 333 has a small or uneven thickness or is not formed on the inclined side surface of the metal pattern 331, the metal pattern 331 may be exposed and thus oxidized. Also, in a subsequent etching process, the metal pattern 331 may undergo unwanted etching. Otherwise, there may be a electrically connection between adjacent layers unintentionally.

Therefore, the source electrode 231 and the drain electrode 234 of the oxide semiconductor thin film transistor 230 may be formed of a metal material capable of being etched through wet etching. Also, the source electrode 231 and the drain electrode 234 may be formed to a small thickness in order for the passivation layer 216 to have a small difference in thickness between a portion of the passivation layer 216 on a flat portion and a portion of the passivation layer 216 on an inclined portion of the source electrode 231 and the drain electrode 234 of the oxide semiconductor thin film transistor 230. To this end, in an embodiment of the present disclosure, the source electrode 231 and the drain electrode 234 of the oxide semiconductor thin film transistor 230 is formed of molybdenum (Mo) and deposited to a thickness of 2000 Å. However, the present disclosure is not limited thereto. The source electrode 231 and the drain electrode 234 of the oxide semiconductor thin film transistor 230 may be formed as a metal layer capable of being etched by an etching method that does not damage the oxide semiconductor layer 232.

Figure 4A:
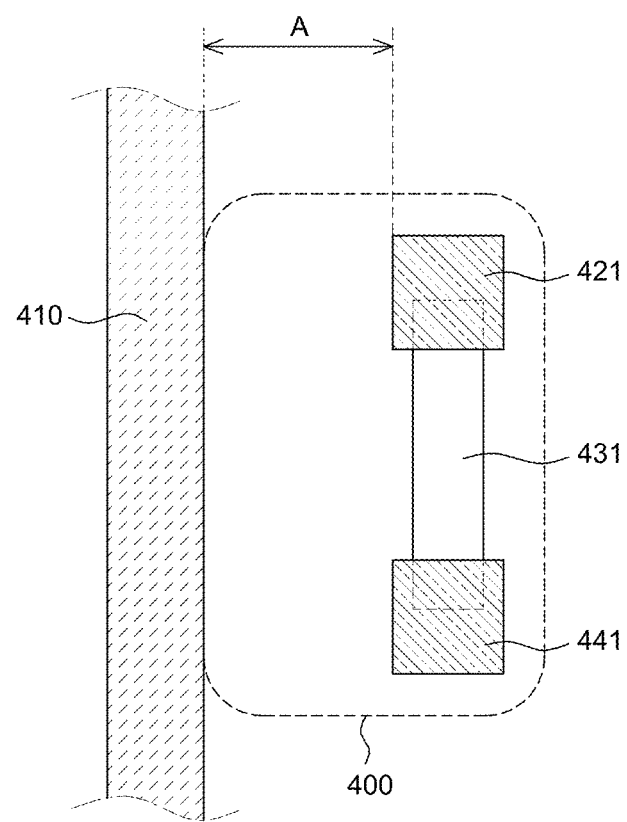
FIG. 4A is a schematic diagram illustrating a part of a pixel according to the Comparative Example.
Figure 4B:
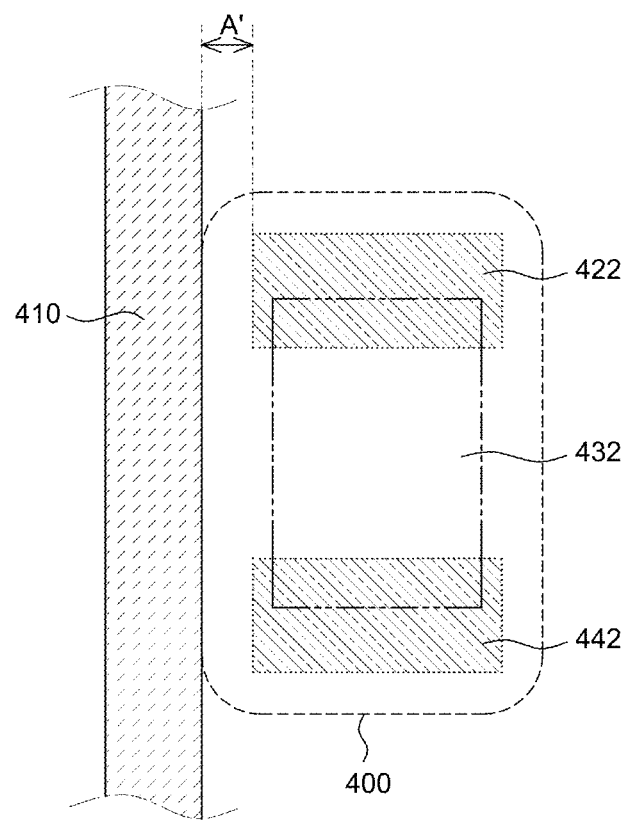
FIG. 4B is a schematic diagram illustrating a part of a pixel according to an embodiment of the present disclosure.
Figure 5A:
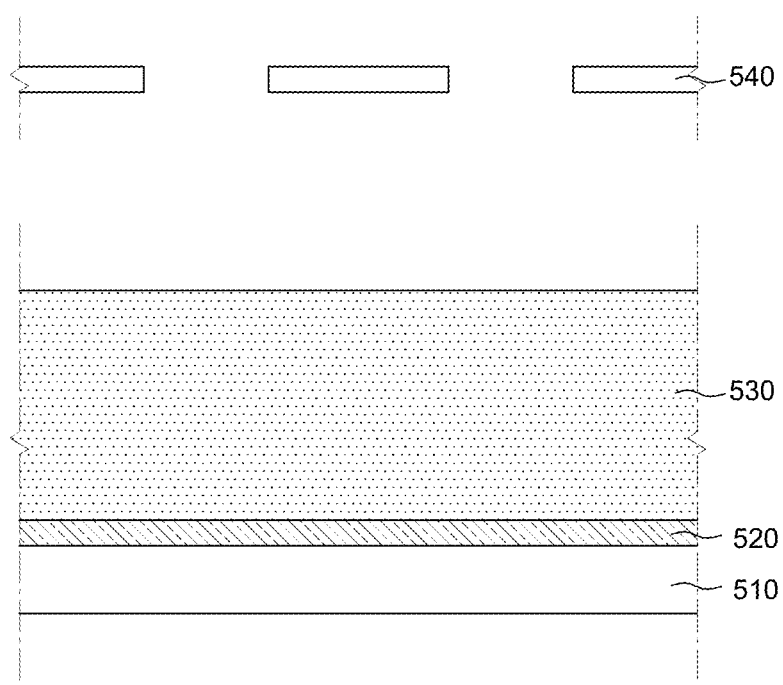
FIG. 5A through FIG. 5C illustrate a process of forming a metal layer according to the Comparative Example.
Figure 5B:
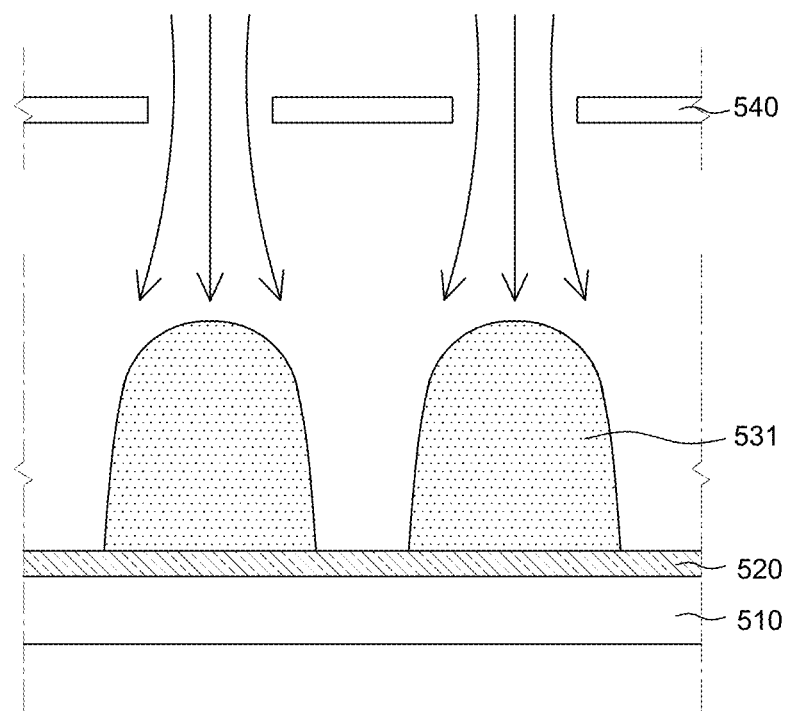
Figure 5C:
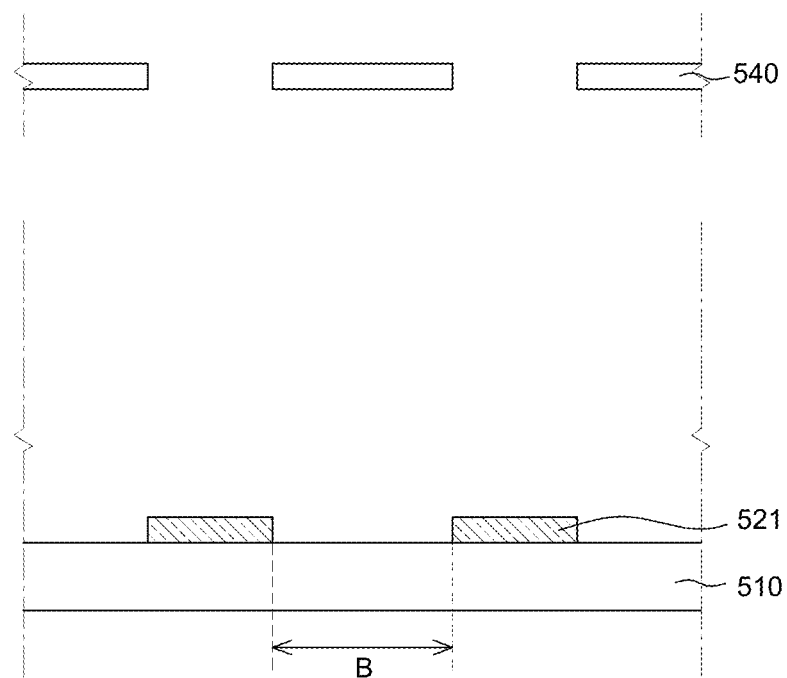
Figure 6A:
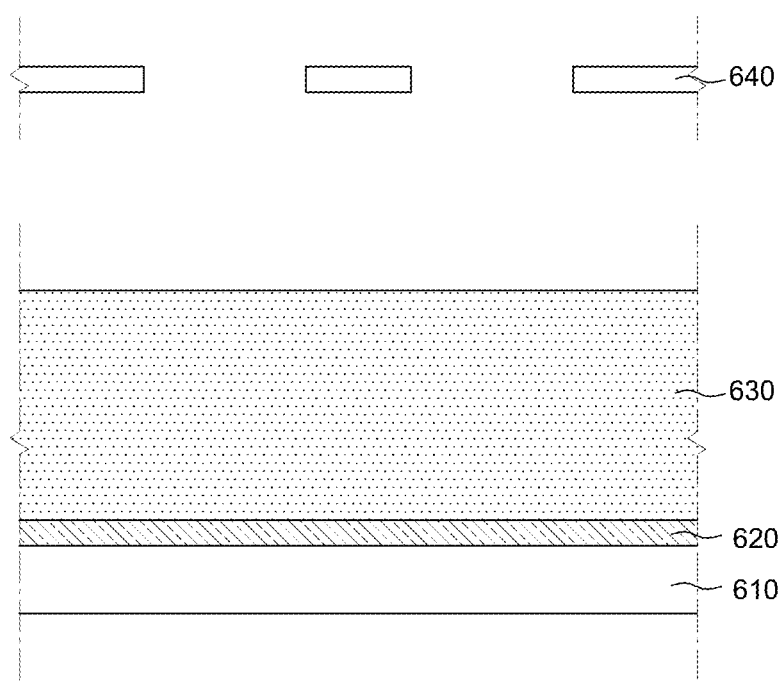
FIG. 6A through FIG. 6C illustrate a process of forming a metal layer according to the Comparative Example.
Figure 6B:
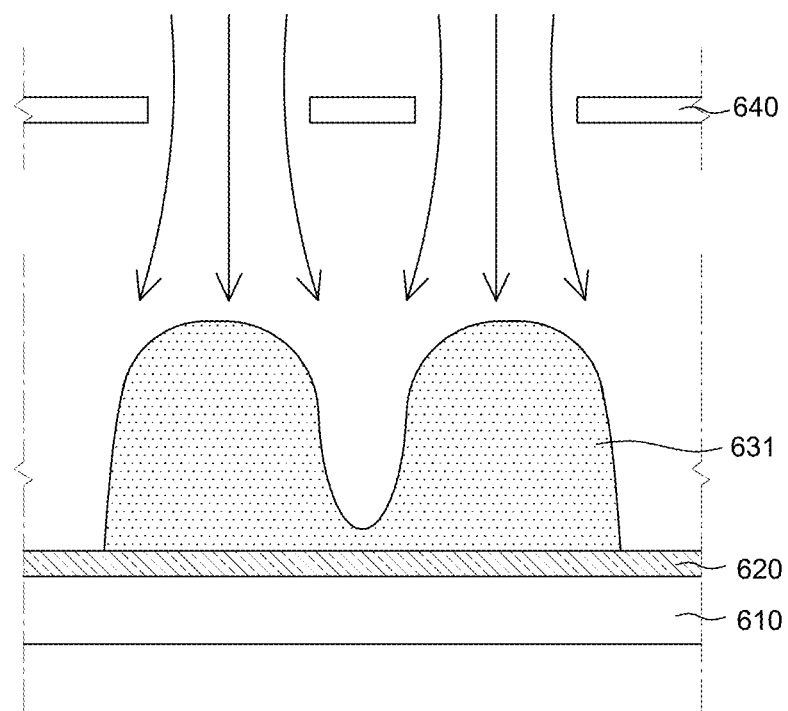
Figure 6C:
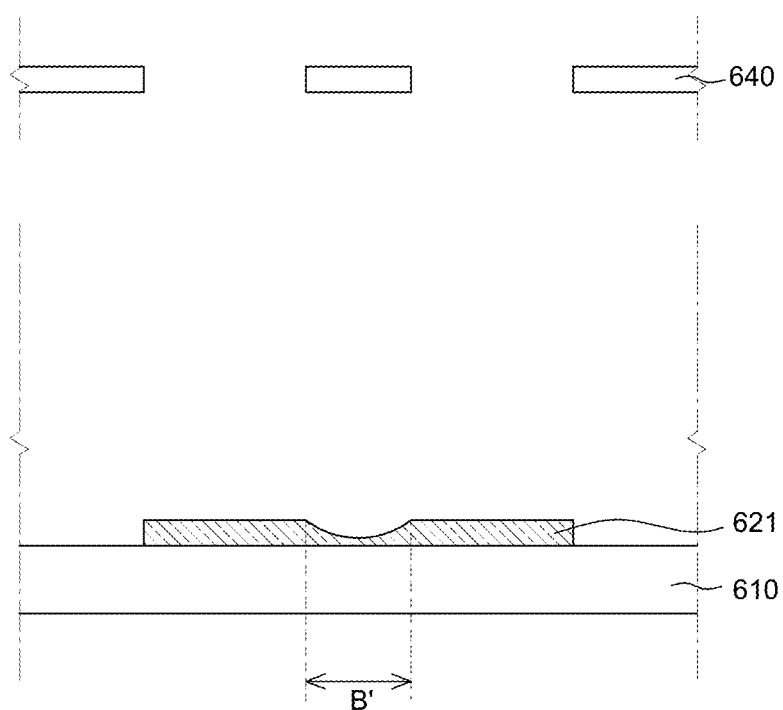

FIG. 4A is a schematic diagram illustrating a part of a pixel according to the Comparative Example, and FIG. 4B is a schematic diagram illustrating a part of a pixel according to an embodiment of the present disclosure. FIG. 5A through FIG. 5C illustrate a process of forming a metal layer according to the Comparative Example, and FIG. 6A through FIG. 6C illustrate a process of forming a metal layer according to the Comparative Example.

Referring to FIG. 4A, a source electrode 421 or a drain electrode 441 of the oxide semiconductor thin film transistor 230 may be disposed adjacent to a high-potential voltage supply line (VDDL) 410. Further, an oxide semiconductor layer 431 is disposed between the source electrode 421 and the drain electrode 441. The oxide semiconductor layer 431 may be overlapped with a part of the source electrode 421 or the drain electrode 441. An area 400 indicated by a dotted line is an affordable area where the oxide semiconductor thin film transistor can be positioned within a pixel.

In general, a current Ids between a drain electrode and a source electrode of a transistor is represented by the following equation.

$$Ids = \tfrac{1}{2} * (\mu * C * W/L) * (Vgs - Vth)^2 \quad \text{[Equation]}$$

In the equation, p denotes electron mobility, C denotes capacitance of a gate insulation layer, W denotes channel width of the transistor, and L denotes channel length of the transistor. Further, Vgs denotes difference in voltage between a gate electrode and the source electrode of the transistor and Vth denotes threshold voltage (or critical voltage) of the transistor.

In the equation, the current Ids is proportional to the channel width of the transistor and inversely proportional to the channel length of the transistor. In FIG. 4A, the channel width of the transistor is a width of the oxide semiconductor layer 431 and the channel length of the transistor is a distance between facing interfaces of the source electrode 421 and the drain electrode 441. Although the channel length may be reduced to increase the current Ids of the transistor, the channel length is limited depending on the characteristics of a semiconductor layer element. Therefore, there is a limit to the reduction of the channel length. Also, the channel width may be increased to increase the current Ids of the transistor. However, the high-potential voltage supply line 410 and the source electrode 421 or the drain electrode 441 illustrated in FIG. 4A are disposed on the same layer. Therefore, the high-potential voltage supply line 410 needs to be spaced at a specific distance from the source electrode 421 or the drain electrode 441.

FIG. 5A through FIG. 5C illustrate a process of forming two metal electrodes present on the same layer. A photo resist 530 is deposited on the entire surface of a metal material layer 520 formed on the substrate 510. Then, a mask 540 is disposed on the photo resist 530 in order to form the photo resist 530 into a pattern. The photo resist 530 exposed to a light passing through openings of the mask 540 is patterned according to a photo resist pattern 531. In this case, the photo resist pattern 531 may be formed bigger than the hole (opening) of the mask 540 due to diffraction of the light. In this case, a specific distance B is needed between metal patterns 521 in order for the photo resist patterns 531 not to be overlapped with each other. The distance B may vary depending on a process or a device, but may be about 2 μm.

FIG. 6A through FIG. 6C illustrate a case where a distance B' between metal patterns 621 is set smaller than an allowable range. In this case, a photo resist 630 may remain between the metal patterns 621, i.e., in an area where the photo resist 630 is not supposed to remain, so that an unwanted photo resist pattern 631 may be formed as illustrated in FIG. 6B. Therefore, a metal material layer 620 may not be etched properly. If there is an area where the metal material layer 620 is not etched, an unwanted short may occur. Therefore, the organic light emitting display device 200 may not function properly.

In FIG. 5A through FIG. 6C, a positive type in which a photo resist exposed to light is formed into a pattern has been illustrated as an example. In a negative type in which a photo resist that is not exposed to light is formed into a pattern, a specific distance is needed between metal patterns in the same manner.

Therefore, as illustrated in FIG. 4A, the adjacent metal patterns 410 and 421 disposed on the same layer may be set to be spaced at a particular distance A from each other. Accordingly, since the oxide semiconductor thin film transistor needs to be disposed within the limited area 400 and the source electrode 421 or the drain electrode 441 also needs to be apart from the high-potential voltage supply line (VDDL) by as much as the particular distance A, it is difficult to increase the width of the oxide semiconductor layer 431.

Referring to FIG. 2 again, the source electrode 221 and the drain electrode 224 of the LTPS thin film transistor 220 according to an embodiment of the present disclosure are disposed on different layers from each other. Further, the high-potential voltage supply line (VDDL) is disposed on the same layer and formed of the same material as the source electrode 221 of the LTPS thin film transistor 220. The source electrode 221 of the LTPS thin film transistor 220 and the high-potential voltage supply line VDDL may be formed as a triple layer including titanium (Ti)/aluminum (Al)/titanium (Ti) or molybdenum (Mo)/aluminum (Al)/molybdenum (Mo). Further, the drain electrode 224 of the LTPS thin film transistor 220 may be formed of a metal capable of being wet-etched. For example, the drain electrode 224 may be formed of molybdenum.

Referring to FIG. 2 and FIG. 4B, the high-potential voltage supply line 410 and the source electrode 422 of the oxide semiconductor thin film transistor 230 are disposed in different layers from each other. Therefore, there is no limit to the above-described distance between adjacent metal patterns. Accordingly, the high-potential voltage supply line 410 and the source electrode 422 (or the drain electrode 442) may be disposed more closer to each other than illustrated in FIG. 4A. In some cases, at least a part of the high-potential voltage supply line 410 and at least a part of the source electrode 422 (or the drain electrode 442) may be overlapped with each other. Therefore, the oxide semiconductor layer 432 may be set to have a larger width and the current Ids of the transistor may be further increased.

The embodiments of the present disclosure can also be described as follows:

Embodiments relate to an organic light emitting display device including a substrate and a pixel on the substrate. The pixel includes a driving thin film transistor (TFT) on the substrate, and a switching TFT on the substrate. The driving TFT includes a first active layer including poly-Si, a first insulation layer on the first active layer, and a first source electrode and a first drain electrode electrically connected to the first active layer. At least a portion of the first source electrode and at least a portion of the first drain electrode are disposed on different layers. The switching TFT is electrically connected to the driving TFT. The switching TFT includes a second active layer including oxide semiconductor material. The pixel also includes an organic light emitting diode (OLED) on the substrate. The OLED is electrically connected to the driving TFT.

In one embodiment, the first source electrode and the first drain electrode include different materials.

In one embodiment, the driving TFT further includes a first gate electrode on the substrate overlapping with the first active layer, and the organic light emitting display device further includes a second insulation layer on the first gate electrode and a passivation layer on the second insulation layer and on the second active layer. The portion of the first drain electrode is directly on the second insulation layer, and the portion of the first source electrode is directly on the passivation layer.

In one embodiment, the switching TFT further includes a second source electrode and a second drain electrode electrically connected to the second active layer. At least a portion of the second source electrode or at least a portion of the second drain electrode are disposed on a same layer as the portion of the first drain electrode.

In one embodiment, the organic light emitting display device further includes a power line on the substrate extending in a first direction. The power line is disposed on a same layer as the portion of the first source electrode.

In one embodiment, the organic light emitting display device further includes a data line on the substrate extending in a first direction, and a gate line on the substrate extending in a second direction intersecting the first direction. The pixel is disposed at an intersection of the gate line and the data line. The data line is disposed on a same layer as the portion of the first source electrode.

In one embodiment, the organic light emitting display device further includes a storage capacitor on the substrate. The storage capacitor includes a first capacitor electrode electrically connected to the switching TFT, and a second capacitor electrode electrically connected to the OLED. The first capacitor electrode is disposed on a same layer as the portion of the first drain electrode.

In one embodiment, the second capacitor electrode is disposed on a same layer as the portion of the first source electrode.

In one embodiment, the driving TFT further includes a first gate electrode on the substrate overlapping with the first active layer. The switching TFT further includes a second gate electrode disposed on a same layer as the first gate electrode.

Embodiments also relate to an organic light emitting display device including a substrate, and a pixel on the substrate. The pixel includes a first thin film transistor (TFT) on the substrate. The first TFT includes a first active layer including a first material, and a first source electrode and a first drain electrode electrically connected to the first active layer. At least a portion of the first source electrode and at least a portion of the first drain electrode are disposed on different layers. The pixel also includes a second TFT on the substrate. The second TFT includes a second active layer including a second material different from the first material. The second active layer is disposed on a different layer than the first active layer is disposed on, and a second source electrode and a second drain electrode are electrically connected to the second active layer. The pixel also includes an organic light emitting diode (OLED) on the substrate. The OLED is electrically connected to the first TFT or the second TFT.

In one embodiment, the first material is poly-Si.

In one embodiment, the second material is oxide semiconductor material.

In one embodiment, the first source electrode and the first drain electrode includes different materials.

In one embodiment, the organic light emitting display device further includes a power line on the substrate extending in a first direction. The power line is disposed on a same layer as the portion of the first source electrode.

In one embodiment, at least a portion of the second source electrode and at least a portion of the second drain electrode are disposed on a same layer as the portion of the first drain electrode.

In one embodiment, at least a part of the power line and at least a part of the second source electrode or at least a part of the second drain electrode overlap.

Embodiments also relate to an organic light emitting display device including a substrate and a pixel on the substrate. The pixel includes a driving thin film transistor (TFT) on the substrate. The driving TFT includes a first active layer including poly-Si, a first insulation layer on the first active layer, and a first source electrode and a first drain electrode contacting the first active layer. The pixel also includes a switching TFT on the substrate. The switching TFT is electrically connected to the driving TFT, the switching TFT includes a second active layer including oxide semiconductor material. The pixel also includes an organic light emitting diode (OLED) on the substrate. The OLED is electrically connected to the driving TFT. The pixel also includes a second insulation layer on the first active layer, and a passivation layer on the second insulation layer and on the second active layer. At least a portion of the first drain electrode is disposed on the second insulation layer, and at least a portion of the first source electrode is disposed on the passivation layer.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display device, comprising:
a substrate;
a pixel on the substrate, the pixel including:
a driving thin film transistor (TFT) on the substrate, the driving TFT including:
a first active layer including poly-Si,
a first insulation layer on the first active layer,
at least a part of a second insulation layer on the first insulation layer,
at least a part of a passivation layer on the second insulation layer, and
a first source electrode and a first drain electrode electrically connected to the first active layer, wherein a horizontal portion of the first source electrode is disposed on and contacts the part of the passivation layer, and a horizontal portion of the first drain electrode is disposed on and contacts the part of the second insulation layer and is disposed below and contacts the part of the passivation layer;

a switching TFT on the substrate, wherein the switching TFT is electrically connected to the driving TFT, and wherein the switching TFT includes:

a second active layer including oxide semiconductor material, and a gate electrode overlapping with the second active layer, wherein the second insulation layer is disposed between the second active layer and the gate electrode; and an organic light emitting diode (OLED) on the substrate, wherein the OLED is electrically connected to the driving TFT.

2. The organic light emitting display device of claim 1, wherein the first source electrode and the first drain electrode include different materials.

3. The organic light emitting display device of claim 1, wherein the driving TFT further comprises another gate electrode on the substrate overlapping with the first active layer, wherein the second insulation layer is disposed on the another gate electrode, and wherein the passivation layer is disposed on the second insulation layer and on the second active layer.

4. The organic light emitting display device of claim 3, wherein the switching TFT further includes:

a second source electrode and a second drain electrode electrically connected to the second active layer, wherein at least a horizontal portion of the second source electrode or at least a horizontal portion of the second drain electrode are disposed on a same layer as the horizontal portion of the first drain electrode.

5. The organic light emitting display device of claim 1, further comprising:

a power line on the substrate extending in a first direction, wherein the power line is disposed on a same layer as the horizontal portion of the first source electrode.

6. The organic light emitting display device of claim 1, further comprising:

a data line on the substrate extending in a first direction; and a gate line on the substrate extending in a second direction intersecting the first direction, wherein the pixel is disposed at an intersection of the gate line and the data line, and wherein the data line is disposed on a same layer as the horizontal portion of the first source electrode.

7. The organic light emitting display device of claim 1, further comprising a storage capacitor on the substrate, the storage capacitor including:

a first capacitor electrode electrically connected to the switching TFT; and a second capacitor electrode electrically connected to the OLED, wherein the first capacitor electrode is disposed on a same layer as the horizontal portion of the first drain electrode.

8. The organic light emitting display device of claim 7, wherein the second capacitor electrode is disposed on a same layer as the horizontal portion of the first source electrode.

9. The organic light emitting display device of claim 1, wherein the driving TFT further includes another gate electrode on the substrate overlapping with the first active layer, and wherein the gate electrode of the switching TFT is disposed on a same layer as the another gate electrode.

10. An organic light emitting display device, comprising:
a substrate;
a pixel on the substrate, the pixel including:
a first thin film transistor (TFT) on the substrate, the first TFT including:
a first active layer including a first material,
at least a part of a first insulation layer on the first active layer,
at least a part of a second insulation layer on the first insulation layer,
at least a part of a passivation layer on the second insulation layer, and
a first source electrode and a first drain electrode electrically connected to the first active layer, wherein at least a horizontal portion of the first source electrode is directly disposed on the part of the passivation layer, and at least a horizontal portion of the first drain electrode is directly disposed on the part of the second insulation layer;
a second TFT on the substrate, the second TFT including:
a second active layer including a second material different from the first material, wherein the second active layer is disposed on a different layer than the first active layer is disposed on,
a second source electrode and a second drain electrode electrically connected to the second active layer, and
a gate electrode overlapping with the second active layer, wherein the second insulation layer is disposed between the second active layer and the gate electrode; and
an organic light emitting diode (OLED) on the substrate, wherein the OLED is electrically connected to the first TFT or the second TFT,
wherein the passivation layer covers the second source electrode and the second drain electrode of the second TFT.

11. The organic light emitting device of claim 10, wherein the first material is poly-Si.

12. The organic light emitting device of claim 10, wherein the second material is oxide semiconductor material.

13. The organic light emitting display device of claim 10, wherein the first source electrode and the first drain electrode includes different materials.

14. The organic light emitting display device of claim 10, further comprising:

a power line on the substrate extending in a first direction, wherein the power line is disposed on a same layer as the horizontal portion of the first source electrode.

15. The organic light emitting display device of claim 14, wherein at least a horizontal portion of the second source electrode and at least a horizontal portion of the second drain electrode are disposed on a same layer as the horizontal portion of the first drain electrode.

16. The organic light emitting display device of claim 15, wherein at least a part of the power line and at least a part of the second source electrode or at least a part of the second drain electrode overlap.

17. The organic light emitting display device of claim 4, wherein the second source electrode and the second drain electrode is disposed on at least a part of the second active layer.

18. The organic light emitting display device of claim 17, wherein the second source electrode and the second drain electrode include same materials as the first drain electrode.

19. The organic light emitting display device of claim 10, wherein the second source electrode and the second drain electrode is disposed on at least a part of the second active layer.

20. The organic light emitting display device of claim 19, wherein the second source electrode and the second drain electrode include same materials as the first drain electrode.

21. An organic light emitting display device, comprising:
a substrate;
a pixel on the substrate, the pixel including:
 a driving thin film transistor (TFT) on the substrate, the driving TFT including:
  a first active layer including poly-Si,
  a first insulation layer on the first active layer, and
  a first source electrode and a first drain electrode contacting the first active layer;
 a switching TFT on the substrate, wherein the switching TFT is electrically connected to the driving TFT, and wherein the switching TFT includes:
  a second active layer including oxide semiconductor material,
  a second source electrode and a second drain electrode electrically connected to the second active layer, and
  a gate electrode overlapping with the second active layer;
 an organic light emitting diode (OLED) on the substrate, wherein the OLED is electrically connected to the driving TFT;
 a second insulation layer on the first active layer; and
 a passivation layer on the second insulation layer and on the second active layer,
 wherein the second insulation layer is disposed between the second active layer and the gate electrode,
 wherein at least a horizontal portion of the first drain electrode is directly disposed on the second insulation layer, and wherein at least a horizontal portion of the first source electrode is directly disposed on the passivation layer, and
 wherein the passivation layer covers the second source electrode and the second drain electrode of the switching TFT.

22. The organic light emitting display device of claim 21, wherein the second source electrode and the second drain electrode is disposed on at least a part of the second active layer.

23. The organic light emitting display device of claim 22, wherein the second source electrode and the second drain electrode include same materials as the first drain electrode.

* * * * *